United States Patent [19]

Tesch

[11] Patent Number: 5,138,319
[45] Date of Patent: Aug. 11, 1992

[54] TWO STAGE A/D CONVERTER UTILIZING DUAL MULTIPLEXED CONVERTERS WITH A COMMON CONVERTER

[75] Inventor: Bruce J. Tesch, Melbourne, Fla.

[73] Assignee: Harris Corporation, Melbourne, Fla.

[21] Appl. No.: 750,752

[22] Filed: Aug. 20, 1991

Related U.S. Application Data

[63] Continuation of Ser. No. 575,367, Aug. 30, 1990, abandoned.

[51] Int. Cl.[5] ..................... H03M 1/14; H03M 1/42
[52] U.S. Cl. ................................. 341/156; 341/141; 341/145; 341/172
[58] Field of Search ............. 341/141, 156, 145, 161, 341/162, 163, 146, 172, 150

[56] References Cited

U.S. PATENT DOCUMENTS

| | | | |
|---|---|---|---|
| 3,820,112 | 6/1974 | Roth | 341/899 |
| 3,877,023 | 4/1975 | Spicer et al. | 341/141 |
| 4,129,863 | 12/1978 | Gray et al. | 341/172 |
| 4,200,863 | 4/1980 | Hodges et al. | 341/156 |
| 4,345,241 | 8/1982 | Takeuchi et al. | 341/141 |
| 4,380,756 | 4/1983 | Worsman | 341/172 |
| 4,388,612 | 6/1983 | Takagi et al. | 341/145 |
| 4,531,113 | 7/1985 | Abraham | 341/172 |
| 4,591,832 | 5/1986 | Fling et al. | 341/141 |
| 4,618,852 | 10/1986 | Kelley et al. | 341/172 |
| 4,745,393 | 5/1988 | Tsukada et al. | 341/156 |
| 4,903,028 | 2/1990 | Fukushima | 341/156 |
| 4,940,981 | 7/1990 | Naylor et al. | 341/161 |
| 4,982,194 | 1/1991 | Bacrania et al. | 341/172 |

*Primary Examiner*—Howard L. Williams
*Attorney, Agent, or Firm*—Barnes & Thornburg

[57] ABSTRACT

A converter including an even and an odd digital-to-analog converter for converting digital signals from a successive approximation circuit and controlling the odd and even converters and the analog-to-digital converter device to alternate conversion by the even and odd converters. The odd and even converters operate in oppostie phases such that while one is in an acquisition phase the other is in a conversion phase. Each of the odd and even converters includes a separate coarse digital-to-analog converter and a common fine digital-to-analog converter. The control circuit resets the fine digital-to-analog converter during an initial portion of the conversion phase of each of the coarse digital-to-analog converters. In a two stage flash converter, the first stage includes a single analog-to-digital converter and the second stage includes a single digital-to-analog converter and alternatingly operating even and odd analog-to-digital converters.

23 Claims, 7 Drawing Sheets

TWO STAGE A/D CONVERTER UTILIZING DUAL MULTIPLEXED CONVERTERS WITH A COMMON CONVERTER

This invention was made with government support under contract DAAA21-86-C-0309. The government has certain rights in this invention.

This is a continuation, of application Ser. No. 07/575,367 filed Aug. 30, 1990, now abandoned.

The present invention relates generally to analog to digital signal converters and, more particularly, to such converters using a successive approximation and two stage or step conversion method.

Successive approximation methods of analog to digital conversion are well-known in the art for producing accurate and relatively high speed digital conversion. Generally, prior art converters using this method compare an unknown analog input signal to one or more precisely known reference signals in a series of digit generating comparison steps. In each step, the relative magnitudes of the analog input signal and the reference signal are compared and an error or difference signal is generated which is compared with another reference signal during the next succeeding step. Each such comparison step provides a digit of the final output signal in descending digital order until the desired level of quantization is reached.

A typical prior art successive approximation analog to digital (A/D) converter is shown in FIG. 1. An analog input signal VIN is applied to comparator 10 along input line 11. clock and control logic means 20, in response to start conversion signal, acquires and initiates conversion of the input analog signal VIN. Comparator 10 outputs a signal to the clock and control logic means 20 which controls an internal successive approximation register (SAR) 30 for producing digital outputs as a function of the output signals from comparator 10. The digital outputs from successive approximation register 30 activate the bits in internal digital to analog (DAC) converter 40, which has a known internal reference voltage, VREF applied thereto. The output from DAC 40 is also applied to comparator 10. The signal from comparator 10 to clock and logic control means 20 represents the difference between the analog input signal and the analog output signal from internal DAC 40.

The speed of successive approximation converters is determined by the amount of time required for the execution of each comparison step. Generally, sufficient time must be allowed prior to the next comparison to permit the transient errors of the circuit to settle out to a necessary minimum level so that an accurate comparison can be made. For converters digitizing to an N bit digital number, N periods of settling are required. Of the three basic components in these converters, the successive approximation register, the DAC, and the comparator, the settling combined time of the DAC and the comparator typically to better than one-half bit accuracy, usually determines the time for each period. For example, if the DAC and comparator settle to one-half bit accuracy in one microsecond per period for a 12 bit converter, then the total minimum conversion time is approximately 12 microseconds.

Since it is generally desirable to decrease the conversion time and increase the speed of operation of such converters, several attempts have been made in the prior art to decrease the settling time allowed for each bit level. However, simply reducing the settling time at each bit level will compromise the conversion accuracy. It is known to use two step or coarse/fine conversion techniques to increase the conversion speed, but only at a cost of significantly increased circuit complexity. In such two step processes, the digital bits determined in two groups by separate analog-to-digital converter. Conversion speed is increased because only two clock cycles are required for the entire conversion.

It is also known to increase conversion speed by employing multiple settling clocks, different for each bit level of successive approximation. However, this again substantially increases the circuit complexity and cost, as opposed to circuits using a single settling time clock for all bit levels.

Another method of reducing the time for conversion is described in U.S. patent application Ser. No. 340,705 filed Apr. 20, 1989 now U.S. Pat. No. 4,982,194 issued Jan. 1, 1991 to Bacrania, et al. It is a back-sampling technique wherein the acquisition is initiated prior to receipt of the start conversion command signal. Thus on receipt of the conversion signal, the acquisition or sample phase is terminated and the approximation phase begins.

While prior art analog-to-digital converters have concentrated on a single conversion cycle, analog signals are received in the series and must be converted. Thus as in the Bacrania application, interrelationship of the signals to be converted provide sources for saving conversion time.

Thus it is an object of the present invention to provide an analog-to-digital converter which increases the conversion speed of a plurality of signals.

Another object of the present invention is to provide an analog-to-digital converter which not only increases conversion speed but uses less die area and power than prior art devices.

These and other objects are achieved by providing an even and an odd digital-to-analog converter for converting digital signals from an analog-to-digital converter or a successive approximation circuit and controlling the odd and even converters and the analog-to-digital converter device to alternate conversion by the even and odd converters. A control circuit controls the odd and even converters to be in opposite phases such that while one is in an acquisition phase the other is in a conversion phase. This overlapping of phases substantially reduces the amount of time for converting a series sequence of analog signals. A comparator is provided for each of the odd and even converters. The control circuit initiates resetting of the comparator of the acquiring even/odd converter simultaneous with initiation of a conversion phase of the other even/odd converter. The control circuit also terminates resetting of the comparator of the acquiring even/odd converter before the termination of the conversion phase of the other even/odd converter.

In one embodiment using the successive approximation method, each of the odd and even converters includes a separate coarse digital-to-analog converter and a common fine digital-to-analog converter. The control circuit resets the fine digital-to-analog converter during an initial portion of the conversion phase of each of the coarse digital-to-analog converters. This sharing of the fine converter reduces the die size required and the power consumption, as well as not increasing the time required to perform the conversion from the overlapping of the odd and even converters.

In another embodiment using the two stage or step flash method, the first flash stage is a coarse analog-to-digital converter which provides the most significant bits or an approximation of the analog input signal. A digital-to-analog converter provides an analog signal of the first stage approximation of the analog input signal. The approximation analog signal is alternately processed by odd and even second stage fine analog-to-digital converters. The digital output signal is a combination of the digital signal from the first stage and the digital signal of either the even or odd converters.

Other objects, advantages and novel features of the present invention will become apparent from the following detailed description of the invention when considered in conjunction with the accompanying drawings.

DETAILED DESCRIPTION OF THE DRAWINGS

Figure 1:
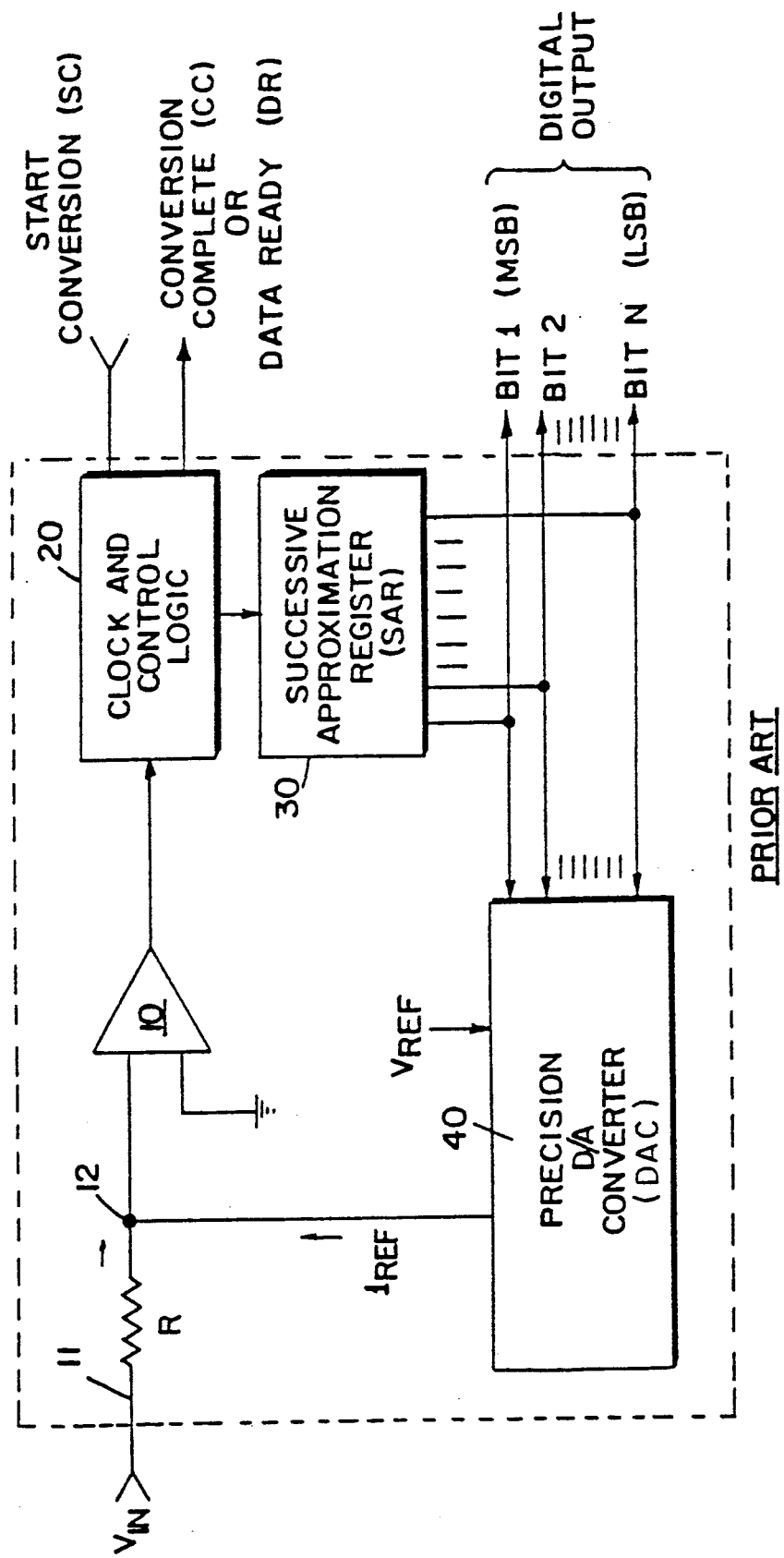
FIG. 1 is a block diagram of a successive approximation analog-to-digital converter of the prior art.
Figure 2:
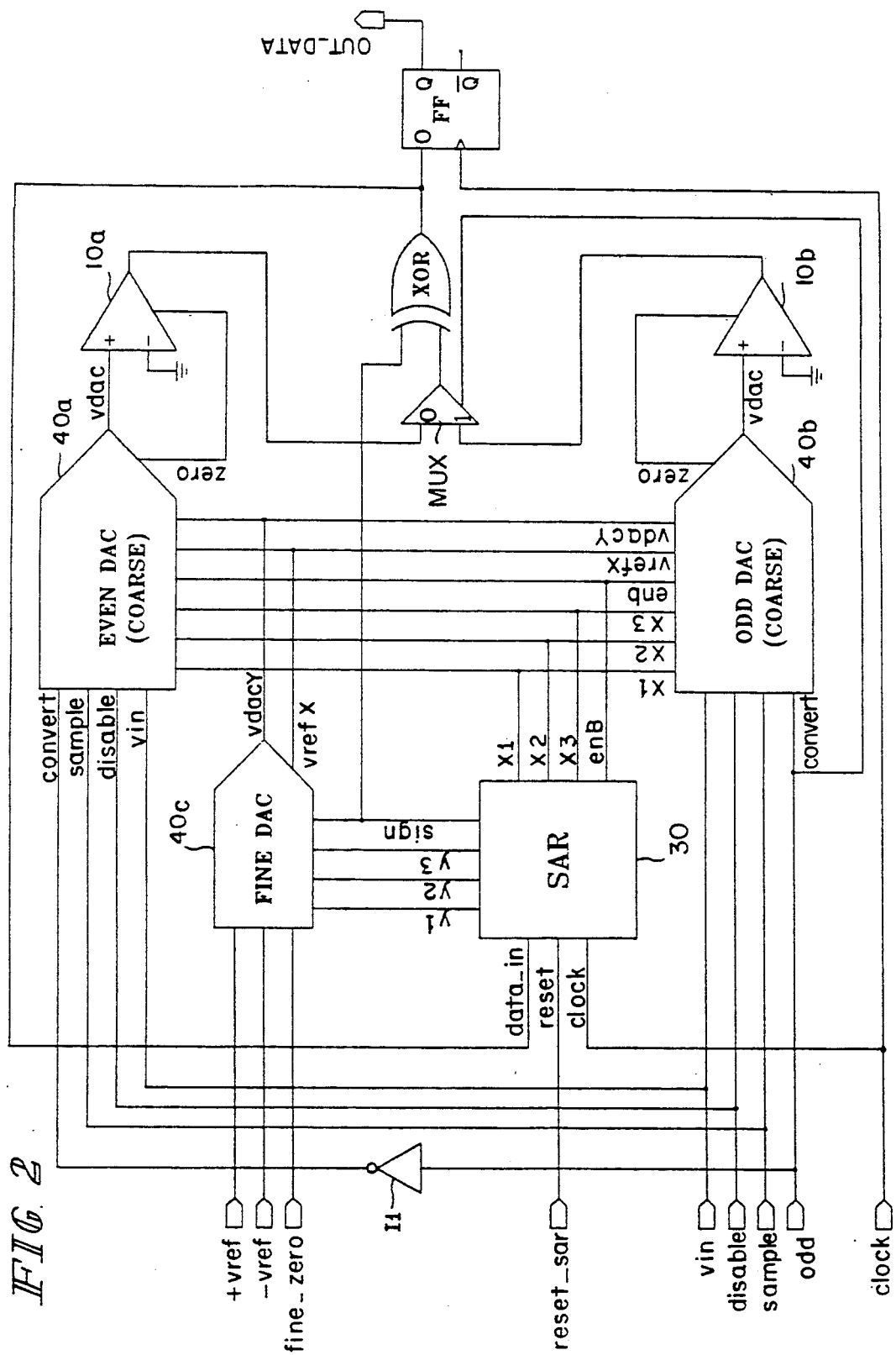
FIG. 2 is a block diagram of a successive approximation analog-to-digital converter incorporating the principles of the present invention.

An analog-to-digital converter is shown in FIG. 2 using the same reference numbers corresponding to the elements as used in FIG. 1. The letters after the numbers indicate that they are part of or a modification of the prior art circuitry of FIG. 1. The clock and control logic 20 at the input is not shown in FIG. 2 and would provide the following signals: FINE ZERO, RESET SAR, DISABLE, SAMPLE, ODD, CLOCK. Additional inputs are ±VREF and VIN.

The precision DAC 40 of FIG. 1 is shown as a pair of coarse DACs, even DAC 40a and odd DAC 40b for performing coarse conversion of the digital signals from the successive approximation register 30, for example, the most significant bits. Each of the coarse DACs share a common fine DAC 40c which receives the least significant bits from the successive approximation register 30. The input signal VIN is provided as an input to the even DAC 40a and the odd DAC 40b. The DISABLE, SAMPLE, and ODD signals from the clock and control logic 20 are provided to the even DAC 40a and the odd DAC 40b with the ODD signal being inverted by I1 before input to the even DAC 40a. The ODD signal and its inverse are the CONVERT ENABLE signals to odd and even DACs 40b and 40a respectively. The FINE ZERO signal is provided to the fine DAC 40c along with the reference signals ±VREF. The analog output of the fine DAC 40c is provided as a VDACY input to the even DAC 40a and odd DAC 40b with the appropriate reference signal VREFX.

The analog input VIN acquired by the even DAC 40a is compared to the analog output of the even DAC 40a and provided to the comparator 10a. The analog input VIN acquired by the odd DAC 40b is compared to the analog output of the odd DAC 40b and provided to the comparator 10b. A control signal ZERO from even DAC 40a and odd DAC 40b is provided to the respective comparators 10a and 10b.

The output of the comparators 10a and 10b is provided to the output logic through a multiplexer MUX which is controlled by the ODD signal. The output of the multiplexer MUX is combined with the SIGN signal from the SAR 30 in an exclusive OR gate XOR. The output of the exclusive OR gate XOR provides a digital feedback DATA IN to the successive approximation register 30 and an input to an output flip flop FF. The flip flop FF provides a series of digital output signals OUT DATA under the control of the clock.

The RESET SAR signal is provided to SAR 30 as well as the clock signal. The third input to the successive approximation register 30 is the DATA IN digital signal available from XOR. The successive approximation register 30 provides the most significant bit controls X1, X2 and X3 as well as the enable signal ENB signal to both the even DAC 40a and odd DAC 40b. The least significant bits Y1, Y2 and Y3 as well as the sign bit SIGN are provided by the SAR 30 to the FINE DAC 40c. The sign bit is also provided to the XOR.

It should be noted that other than the FINE ZERO signal, no special signals are provided by the control clock and control logic 20. The ODD signal is a reclassification of the initiation of the conversion signal SC.

Figure 3:
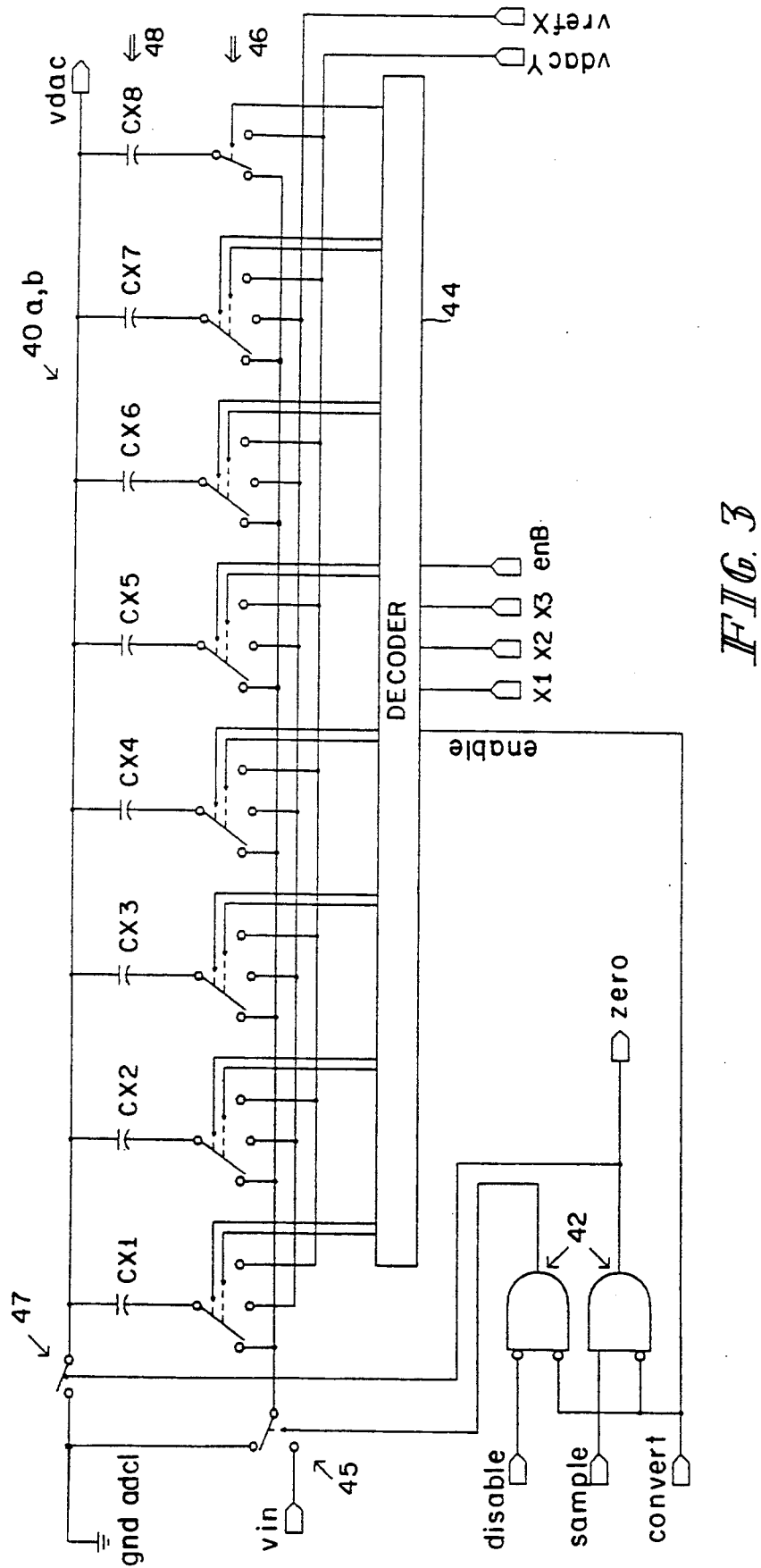
FIG. 3 is a schematic of a coarse even/odd DAC.

A schematic of the even and odd DACs 40a and 40b is illustrated in FIG. 3. The DISABLE and CONVERT signals are provided to an AND gate of an internal control logic 42 which provides a control for the input switch 45 to select between ground or the VIN signal. This switch controls the acquisition or sample phase and the conversion or hold phase through an array of switches 46 to an array of capacitors 48. When both of the DISABLE and CONVERT signals are low, the input switch is moved from the ground to VIN for the acquisition phase. The CONVERT signal is also provided to a decoder 44 which receives inputs through X1, X2 and X3 and ENB from the successive approximation register to control the switches 46. Control logic 42 also includes an AND gate receiving the CONVERT and SAMPLE signals and provides the control signal ZERO to its output comparator 10a or 10b when the CONVERT and SAMPLE signals are low and high respectively. The comparator 10 is reset or zeroed by the ZERO signal in response to the SAMPLE signal during the acquisition phase controlled by the CONVERT signal. The ZERO signal also closes switch 47 to ground the VCAC node. The output of the FINE DAC 40c is provided as inputs VDACY and the reference signal VREFX.

The coarse DAC shown is a segment type where X1, X2 and X3 determine which one of eight segments the input VIN is within. After this occurs, ENB connects VDACY to the appropriate segment capacitor for fine (step-within-segment) resolution by the fine DAC. If this capability is not needed, the coarse DAVs would require only three capacitor stages.

Figure 4:
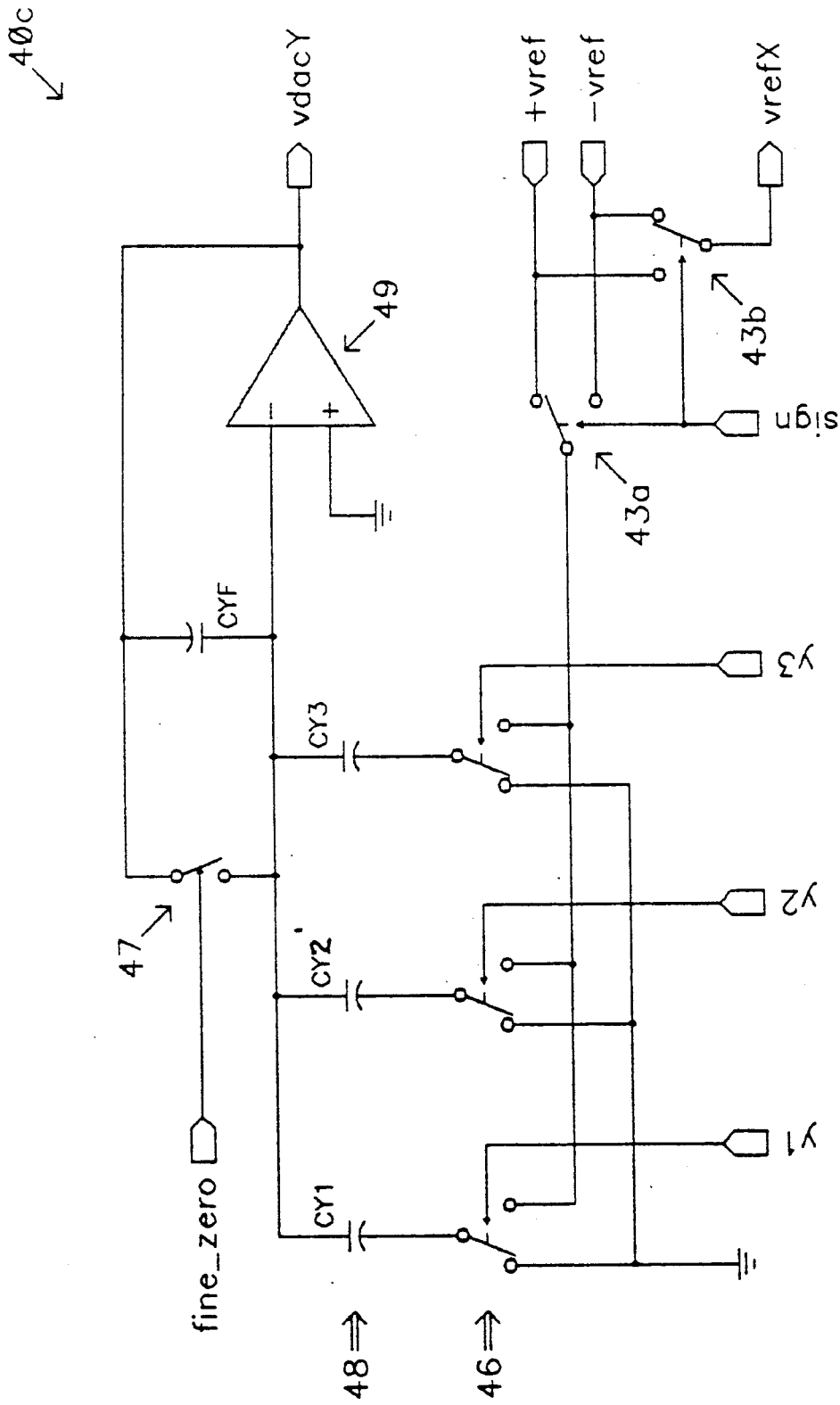
FIG. 4 is a schematic of a fine DAC.

The details of the FINE DAC 40c are illustrated in FIG. 4. The input signals Y1, Y2 and Y3 from SAR 30 are used to control the switches 46 to their respective capacitors 48. The SIGN signal from SAR 30 selects either the +VREF or the −VREF as a reference signal to switch 43a to be provided to the capacitors 48 through the switches 46. Switch 43b, also controlled by the SIGN signal, provides the output signal VREFX to the even and odd coarse DACs 40a and 40b. Connected to the output of the capacitor array 48 is an amplifier 49 whose feedback capacitor CYF is shorted by switch 47 when the signal FINE ZERO is high. The output of the amplifier 49 is the analog signal VDACY which is provided to both the even and odd coarse DACs 40a and 40b.

Figure 5:
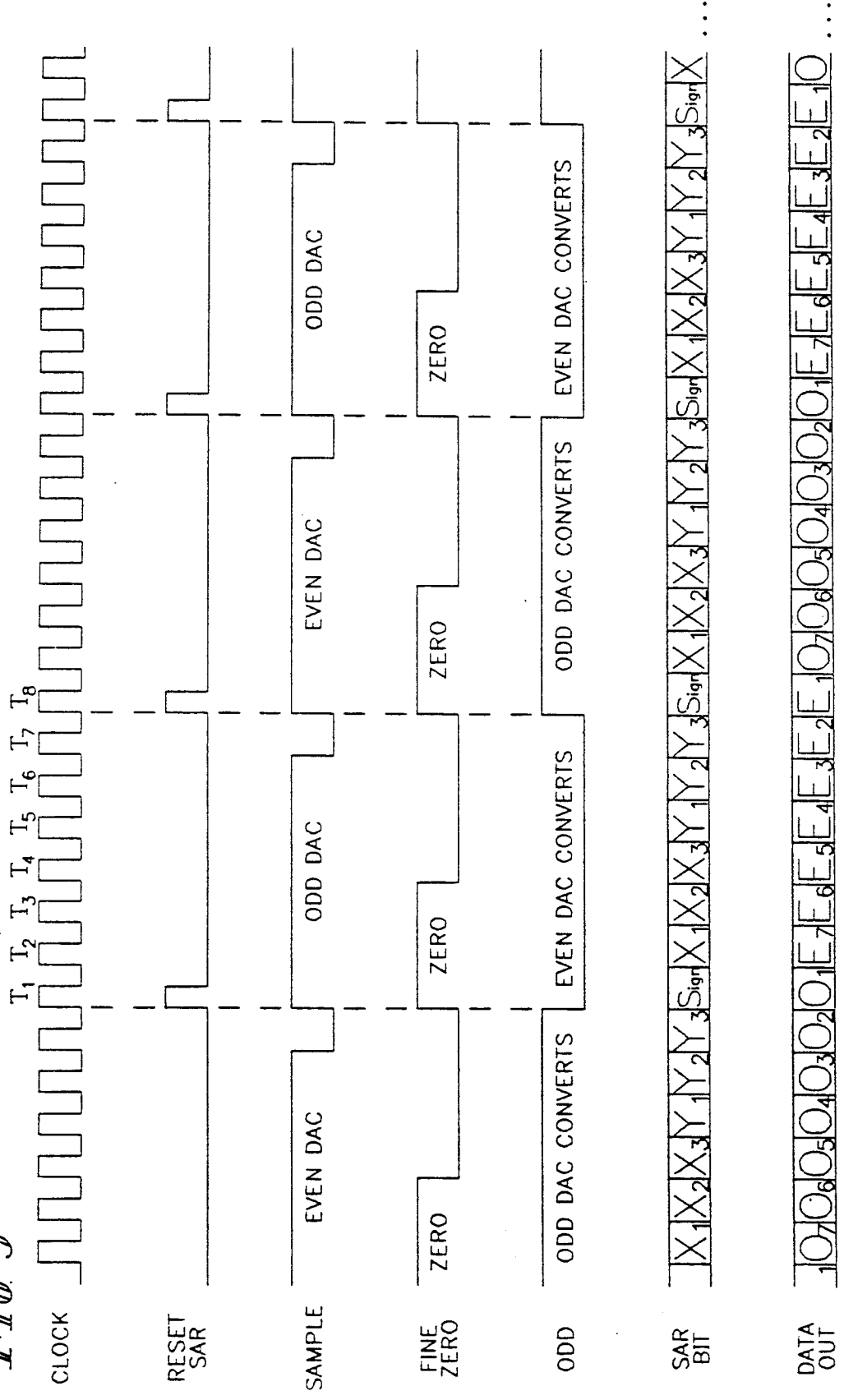
FIG. 5 is a timing diagram for the operations of the analog-to-digital converter of FIG. 2 according to the principles of the present invention.

The operation of the present analog-to-digital converter will be explained for a seven digit conversion with reference to the graphs of FIG. 5. The clock signal is displayed in the first row and each cycle includes seven clock pulses. The SAMPLE signal and the FINE ZERO signals begin each cycle high, go low during the cycle and end the cycle low. The ODD signal alternates between high for one cycle of seven clock pulses and low for one cycle. The SAR bits begin with the Sign bit, followed by the three most significant bits X1, X2, X3 for the coarse DACs and the three least significant bits Y1, Y2, Y3 for the fine DAC. The DATA OUT signal alternates between seven digits of output from the even and odd DACs and is delayed by one clock pulse from the SAR bits.

The cycle begins at T1 with the RESET SAR signal high, the SAMPLE signal high, the FINE ZERO signal high and the ODD signal low. The SAR bit is the SIGN bit and the DATA OUT is the last or least significant bit of the odd DAC. Since the ODD signal is low, the even DAC 40a is switched into a conversion phase and the output MUX is selected to connect the output of the even DAC's comparator 10a to the XOR to provide a feedback to the successive approximation register 30 and the output flip flop FF. The odd DAC 40b is in the acquisition or sample phase, the odd DAC's comparator 10b is being reset or zeroed and the fine DAC 40c is also being reset or zeroed. On the fourth clock signal T4, the FINE ZERO signal goes low, thereby preparing the fine DAC 40c for its conversion phase which begins in T5. On the seventh clock signal T7, the SAMPLE signal goes low, thereby terminating the resetting of the odd DAC's comparator 10b and holding the analog input VIN on the odd DAC 40b capacitor array. On the eighth clock signal T8, the successive approximation register is reset and the ODD signal goes high ending the conversion phase of the even DAC 40a and starting the conversion phase of the odd DAC 40b. The fine DAC 40a is reset and SAMPLE resets the even DAC's comparator 10a and begins acquiring a new input VIN onto the even DAC 40a capacitor array during this cycle.

In summary, each cycle or conversion begins with a resetting of the successive approximation register, a resetting of the fine DAC and beginning the conversion phase of one of the two coarse DACs and the acquisition phase of the other coarse DAC. Also, the comparator of the acquiring DAC is reset or zeroed. Before the end of the conversion cycle, the resetting of the comparator of the acquiring DAC and also the sampling of the input VIN are terminated. By using a common fine DAC 40c in combination with the two coarse DACs 40a and 40b, the power consumption and amount of die space is substantially reduced as compared to using two fine DACs. The resetting of the fine DAC is superimposed on the conversion process and therefore no special separate resetting and acquisition time is required. Since the coarse DACs 40a and 40b alternate in their operation of the conversion, they have more than sufficient time to sample or acquire the input signal. Thus the time required to convert a string of signals is substantially reduced.

Figure 6:
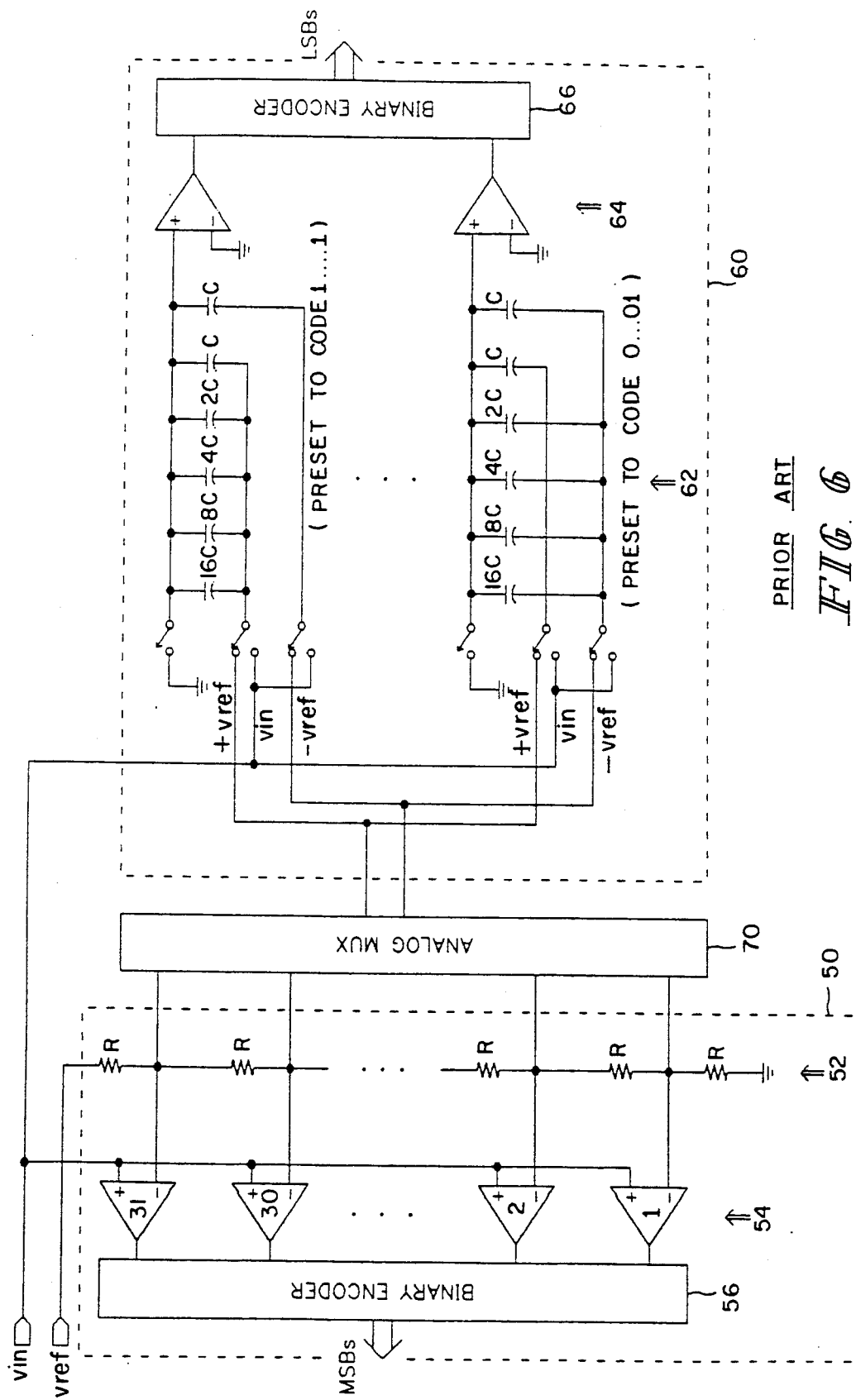
FIG. 6 is a block diagram of a two stage or step flash analog-to-digital converter of the prior art.

A two stage or step flash analog-to-digital converter of the prior art is shown in FIG. 6 as including a first coarse flash stage 50, a an analog reference generating stage 70 and a second fine flash stage 60. The reference signal VREF is provided to the first converter stage 50 and the analog input signal VIN is provided to the first and second converter stages 50 and 60. The first stage 50 includes a resistor string or array 52, a plurality of comparators 54 and a binary encoder 56. The binary encoder 56 provides a digital output of the most significant bits or an approximation of the analog input as a function of the states of the comparators 54. The stage 70 includes an analog multiplexer which determines the pair of points on the resistor string where the comparators 54 change state from a one to a zero and provide these as inputs ±VREF to the second stage flash converter 60. Other types of digital-to-analog converters can be used between the two flash converter stages. The second stage flash converter 60 includes a plurality of parallel capacitor arrays 62 and comparators 64 connected to a binary encoder 66, whose digital output signal is the least significant bits of the analog input VIN. An output circuit combines the output of the two flash converter stages.

Figure 7:
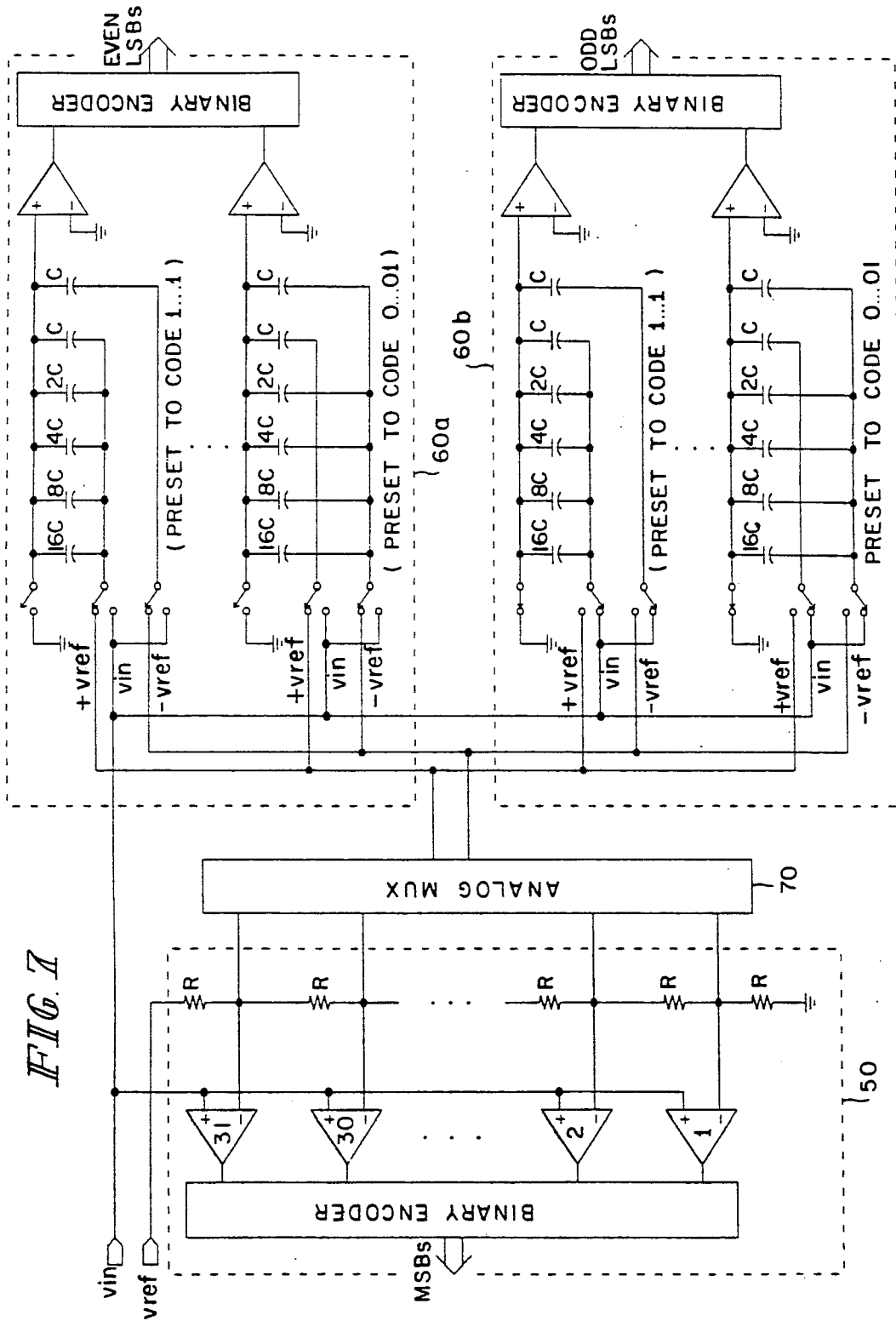
FIG. 7 is a block diagram of a two stage or step flash analog-to-digital converter incorporating the principles of the present invention.

An application of the present invention to the two stage flash analog-to-digital converter of FIG. 6 is shown in FIG. 7. The major modification is that a pair of flash converters 60a and 60b have been substituted for the single flash converter 60. The even and odd flash converters 60a and 60b respectively are operated alternately as described for the converters 40a and 40b of FIG. 2. While one is in the conversion phase, the other is in the acquisition phase. Also, a single first flash stage 50 with a single analog reference generator 70 is used with the alternating flash stages 60a and 60b. Appropriate control signals are provided to produce the alternation. Also, a multiplexer can be provided at the output of the flash converters 60a and 60b.

Although the present invention has been described and illustrated in detail, it is to be clearly understood that the same is by way of illustration and example only, and is not to be taken by way of limitation. The DACs 40a, b, c have been shown as capacitive array but other arrays, such as resistive arrays, may be used for any or all of the DACs. The low to high transition of the sample signal may be delayed from the beginning of the cycle. The spirit and scope of the present invention are to be limited only by the terms of the appended claims.

What is claimed:
1. An analog-to-digital converter comprising:
input means for receiving analog input signals;
successive approximation means for providing successive digital signals approximating an input analog signal;
even converter means including a coarse digital-to-analog converter for converting said successive digital signals to an even analog signal;
odd converter means including a coarse digital-to-analog converter for converting said successive digital signals to an odd analog signal;
a fine digital-to-analog converter shared by said even and odd converter means;
comparator means for comparing said even and odd analog signals to said analog input signal and providing the results to said successive approximation means;

output means for providing a digital output signal; and control means for controlling said successive approximation means and said even and odd converter means to alternate conversion by said even and odd converter means.

2. An analog-to-digital converter according to claim 1, wherein said even and odd converter means each include an acquisition phase and a conversion phase, and said control means controls said even and odd converter means to be in opposite phases.

3. An analog-to-digital converter according to claim 2, wherein said even and odd converter means each include a capacitive array.

4. An analog-to-digital converter according to claim 2, wherein said even and odd converter means each include a switched capacitor, redistribution array.

5. An analog-to-digital converter according to claim 2, wherein said comparator means includes an even comparator means for comparing said even analog signal to said analog input signal and an odd comparator means for comprising said odd analog signal to said analog input signal.

6. An analog-to-digital converter according to claim 5, wherein said control means initiates resetting the comparator of said even converter means simultaneous with the initiation of a conversion phase of said odd converter means and terminates the resetting of the comparator of said even converter means before the termination of the conversion phase of said odd converter means.

7. An analog-to-digital converter according to claim 1, wherein said control means resets said fine digital-to-analog converter during the initial portion of the conversion phase of each of said coarse digital-to-analog converter.

8. An analog-to-digital converter according to claim 1, wherein said comparator means includes an even comparator means for comparing said even analog signal to said analog input signal and an odd comparator means for comparing said odd analog signal to said analog input signal.

9. An analog-to-digital converter according to claim 8, wherein said control means initiates resetting the comparator of said even converter means simultaneous with the initiation of a conversion phase of said odd converter means and terminates the resetting of the comparator of said even converter means before the termination of the conversion phase of said odd converter means.

10. An analog-to-digital converter according to claim 9, wherein said control means resets said fine digital-to-analog converter during the initial portion of a conversion phase of each of said coarse digital-to-analog converters.

11. An analog-to-digital converter according to claim 10, wherein said control means initiates an acquisition phase of one of the converter means simultaneous with the initiation of a conversion phase of the other converter means and terminates the acquisition phase. of the one converter means before the termination of the conversion phase of the other converter means.

12. An analog-to-digital converter comprising:
input means for receiving analog input signals;
analog-to-digital flash converter means including a resistor array for providing digital signals approximating an input analog signal;

reference means for generating from said approximating digital signals a pair of reference analog signals;

even flash converter means including a capacitor arrays for converting said analog input signals to even digital signals using said pair of reference analog signals;

odd flash converter means including a capacitor arrays for converting said analog input signals to odd digital signals using said pair of reference analog signals;

output means for providing a digital output signal as a combination of said approximating digital signals and either said even or odd digital signals; and control means for controlling said analog-to-digital flash converter means, said reference means and said even and odd flash converter means to alternate conversion by said even and odd flash converter means.

13. An analog-to-digital converter according to claim 12, wherein said analog-to-digital flash converter means includes a resistor array and said reference means includes an analog multiplexer connected to said resistor array for selecting said pair of reference analog values from said resistor array as a function of said approximating digital signals.

14. An analog-to-digital converter comprising:
input means for receiving analog input signals;
analog-to-digital means for providing digital signals approximating an input analog signal;
even converter means including an even coarse digital-to-analog converter for converting said digital signals to an even analog signal;
odd converter means including an odd coarse digital-to-analog converter for converting said digital signals to an odd analog signal;
a fine digital-to-analog converter shared by said odd and even converter means;
comparator means for comparing said even and odd analog signals to said analog input signal and providing the results to said analog-to-digital means;
output means for providing a digital output signal; and
control means for controlling said analog-to-digital means and said even and odd converter means to alternate conversion by said even and odd converter means.

15. An analog-to-digital converter according to claim 14, wherein said comparator means includes an even comparator means for comparing said even analog signal to said analog input signal and an odd comparator means for comparing said odd analog signal to said analog input signal.

16. An analog-to-digital converter according to claim 15, wherein said control means initiates resetting the comparator of said even converter means simultaneously with the initiation of a conversion phase of said odd converter means and terminates the resetting of the comparator of said even converter means before the termination of the conversion phase of said odd converter means.

17. An analog-to-digital converter according to claim 15, wherein said control means resets said fine digital-to-analog converter during the initial portion of a conversion phase of each of said coarse digital-to-analog converters.

18. A method of converting an analog input signal to a digital output signal comprising the steps of:

converting an analog input signal to digital signals approximating said input analog signal;
converting said digital signals to an even analog signal using an even converter including a coarse digital-to-analog converter;
alternately converting digital signals to an odd analog signal using an odd converter including a coarse digital-to-analog converter;
using a common fine digital-to-analog converter with said even and odd converter; and
comparing said even and odd analog signals to said analog input signal and using the results in the first mentioned step to produce said digital output signal.

19. A method according to claim 18 including initiating resetting a comparator for said even converter simultaneous with the initiation of a conversion phase of said odd converter and terminating the resetting of a comparator for said even converter before the termination of the conversion phase of said odd converter.

20. A method according to claim 18, including resetting said fine digital-to-analog converter during the initial portion of the conversion phase of each of said coarse digital-to-analog converters.

21. A method according to claim 18, including initiating an acquisition phase of one of the even and odd converters simultaneous with the initiation of a conversion phase of the other even and odd converters and terminating the acquisition phase of the one even and odd converters before the termination of the conversion phase of the other even and odd converters.

22. A method according to claim 18, wherein said first mentioned step is performed by a successive approximation analog-to-digital converter.

23. A method of converting an analog input signal to a digital output signal comprising the steps of:
converting an analog input signal to digital signals approximating said input analog signal using a flash converter including a resistor array;
generating from said approximating digital signals a pair of reference analog signals;
converting said analog input signals to even digital signals using said pair of reference analog signals and an even flash converter including capacitor arrays;
alternately converting said analog input signals to odd digital signals using said pair of reference analog signals and odd flash converter including capacitor arrays; and
providing a digital output signal as a combination of said approximating digital signals and either said even or odd digital signals.

* * * * *